United States Patent [19]

Lehman

[11] Patent Number: 4,724,409
[45] Date of Patent: Feb. 9, 1988

[54] MICROWAVE CIRCUIT PACKAGE CONNECTOR

[75] Inventor: George R. Lehman, Buellton, Calif.

[73] Assignee: Raytheon Company, Lexington, Mass.

[21] Appl. No.: 891,100

[22] Filed: Jul. 31, 1986

[51] Int. Cl.$^4$ ............................................. H01P 5/00
[52] U.S. Cl. .................................... 333/260; 333/238; 439/581
[58] Field of Search .................. 333/33, 34, 260, 238, 333/246; 339/17 R, 177 R

[56] References Cited

U.S. PATENT DOCUMENTS

| | | | |
|---|---|---|---|
| 3,201,721 | 8/1965 | Voelcker | 333/33 |
| 3,662,318 | 5/1972 | Decuyper | 333/33 X |
| 3,686,624 | 8/1972 | Napoli et al. | 333/33 X |
| 3,705,379 | 12/1972 | Bogar | 333/33 X |
| 4,125,308 | 11/1978 | Schilling | 339/177 R X |
| 4,186,358 | 1/1980 | Czech et al. | 333/33 |
| 4,346,355 | 8/1982 | Tsukii | |
| 4,611,186 | 9/1986 | Ziegner | 333/260 X |
| 4,656,441 | 4/1987 | Takahashi et al. | |

OTHER PUBLICATIONS

"Reference Data for Radio Engineers, Fifth Edition"; Published by Howard W. Sams, Inc., 1968; pp. 22–25.

Primary Examiner—Paul Gensler
Attorney, Agent, or Firm—Richard M. Sharkansky

[57] ABSTRACT

A sealed, electrically conducting package having a strip transmission line disposed therein. The package comprises a connector mounted in a wall of the package at a first end of the connector, with a second end of the connector protruding into the package. The connector has an electrically conductive shell which is substantially cylindrical at the first end of the connector and secured to the wall. A center conductor is disposed longitudinally through the connector, the center conductor having a generally circular cross-section at the first end of the connector and having a generally semicircular cross section, comprising a rounded portion and a planar portion, at the second end of the connector. The shell is disposed about substantially only the rounded portion of the center conductor at the second end of the connector. An electrically conductive member is coupled between the planar portion of the center conductor and the strip transmission line. With such arrangement, the connector itself provides electrical transition between a coaxial transmission line mode (at the first end of the connector) and a strip transmission line mode (at the second end of the connector) thereby decreasing the overall size and complexity of the package due to the elimination of the conventional input/output circuit section for providing transition between a coaxial transmission line mode and a strip transmission line mode.

8 Claims, 2 Drawing Figures

MICROWAVE CIRCUIT PACKAGE CONNECTOR

BACKGROUND OF THE INVENTION

This invention relates generally to electrical device packages and more particularly to electrical device packages for microwave integrated circuits.

As is known, microwave circuits such as amplifiers are increasingly being fabricated in the form of monolithic integrated circuits (MIC's) which are mounted in a hermetically sealed package. The integrated circuit, which may be, for example, a microwave monolithic integrated circuit (MMIC) amplifier, is typically mounted on a carrier which comprises microstrip circuitry, that is, circuitry comprising strip transmission lines disposed on a first surface of a dielectric substrate with a single ground plane being disposed on the second surface of the substrate, for coupling microwave signals to and from the MIC. The MIC package typically comprises a hermetically sealed housing typically having one or more microwave coaxial feed-through connectors mounted in the walls thereof for coupling microwave signals to and from the inputs and outputs of the MIC device via the microstrip circuitry disposed on the MMIC carrier.

Such coaxial connector is generally cylindrical in shape and conventionally comprises a generally circular cross-sectioned center conductor disposed coaxially in an insulator, such as glass, and extending longitudinally through the cylindrical connector. Surrounding the glass insulator is a metal cylindrical shell which passes through the wall of the package housing and is hermetically sealed thereto, such as by soldering. The center conductor protrudes beyond the metal shell externally to the package and is adapted to receive a microwave transmission line, such as a microstrip transmission line, at, for example, a "lap joint" between the center conductor and transmission line. The center conductor typically extends a short distance into the package beyond the metal shell. Conventionally, the package housing comprises a microstrip input/output stage, which provides electrical transition and impedance matching between the coaxial transmission line mode of the coaxial connector (and microwave transmission line circuitry external to the package housing) and the microstrip transmission line mode of the MMIC carrier inside the package. The input/output circuit section comprises a microstrip transmission line section soldered to the package housing via the ground plane thereof. A first end of the input/output circuit underlies the protruding center pin of the package coaxial connector. The center pin is soldered to the strip transmission line of the input-/output circuit. The second end of the input/output circuit is disposed adjacent to the microstrip monolithic integrated circuit carrier. Electrical connection is made therebetween by a short, flexible member of electrically conductive ribbon, such as gold ribbon, between the transmission lines of the input/output section and the integrated circuit carrier. The dimensions of the package connector center pin, the input/output circuit transmission line and the ribbon member are selected to provide impedance matching at the characteristic impedance, such as 50 ohms, throughout the coaxial-to-microstrip transition of the MIC package.

While such arrangement for providing a transition from a coaxial transmission line mode to a microstrip transmission line mode is adequate in some applications, the requirement for providing a separate input/output transmission line circuit section for each package coaxial connector increases the complexity of the MMIC package by requiring each package to contain more parts. Additional machining of the package housing is required to accommodate the input/output circuit sections, and the overall package size is increased due to the presence of such input/output sections. Also, the soldered or welded lap joint connection between the coaxial connector center pin and the input/output circuit transmission line is rigid and thus may crack and fail due to thermal expansion or contraction of the input/output circuit.

SUMMMARY OF THE INVENTION

In accordance with the present invention, a package is provided having a strip transmission line circuit disposed therein, the package comprising: a connector mounted in a wall of the package, the connector comprising an outer, coaxial transmission line portion and an inner, strip transmission line portion; and, means for electrically coupling the inner, strip transmission line portion to the strip transmission line circuit. With such arrangement, the coaxial connector itself provides the transition from a coaxial transmission line mode to a strip transmission line mode within the package, thereby allowing the conventional input/output circuit section to be omitted from the package.

In a preferred embodiment of the present invention, a strip transmission line is provided disposed within a sealed, electrically conducting package. The package comprises a connector mounted in a wall of the package at a first end of the connector, with a second end of the connector protruding into the package, the connector comprising: an electrically conductive shell, such shell being substantially cylindrical at the first end of the connector and being secured to the wall; a center conductor disposed longitudinally through the connector, the center conductor having a generally circular cross-section at the first end of the connector and having a generally semicircular cross section, comprising a rounded portion and a planar portion, at the second end of the connector, with the shell being disposed about substantially only the rounded portion of the center conductor at the second end of the connector; and, an electrically conductive member coupled between the planar portion of the center conductor and the strip transmission line. With such arrangement, the connector itself provides electrical transition between a coaxial transmission line mode (at the first end of the connector) and a strip transmission line mode (at the second end of the connector) thereby decreasing the overall size and complexity of the package due to the elimination of the conventional input/output circuit section for providing transition between a coaxial transmission line mode and a strip transmission line mode. Thus, the package requires fewer parts. Additionally, the "lap joint" connection associated with the conventional input/output section is eliminated and replaced, in the preferred embodiment, with the strip member connecting the planar portion of the center conductor and strip transmission line, such strip member comprising a flexible metal ribbon, thereby allowing for thermal expansion or contraction of the structures mounted within the package without breaking the connection between the connector center conductor and the strip transmission line. Additionally, the center conductor and ribbon member are selected to provide impedance matching at a characteristic impedance, such as 50 ohms, between the coaxial transmission line and the strip transmission line.

BRIEF DESCRIPTION OF THE DRAWINGS

The foregoing features of the invention, and the advantages thereof, may be fully understood from the following detailed description read in conjunction with the accompanying drawings wherein.

DESCRIPTION OF THE PREFERRED EMBODIMENT

Figure 1:
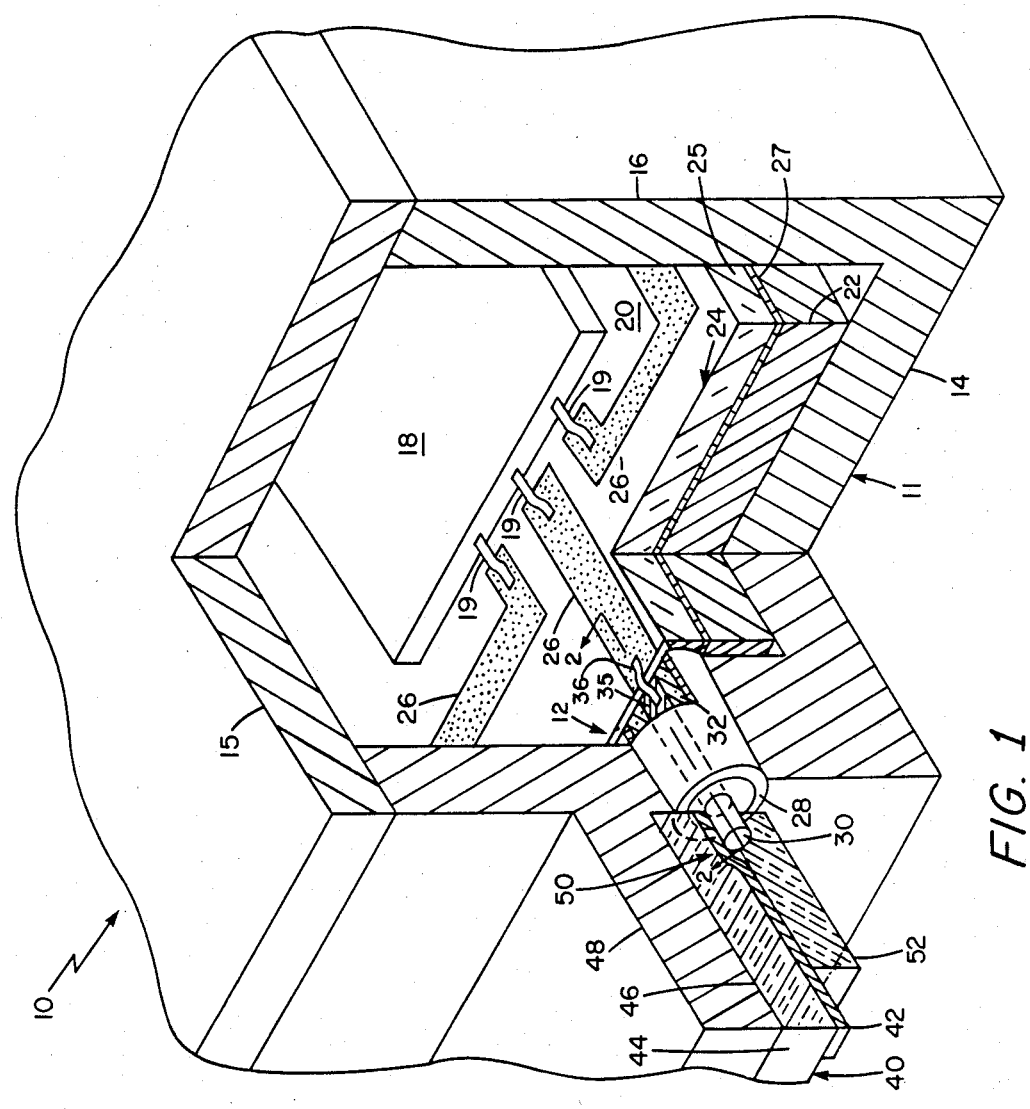
FIG. 1 is an isometric view, partially broken away, of a microwave circuit package comprising the connector of the present invention.

Referring to FIG. 1, a microwave circuit package 10 is shown partially cut away to expose the feedthrough connector 12 of the present invention. Package 10 is a conventional structure and here comprises an electrically conductive integral housing 11 here made from Kovar and comprising a base portion 14 and side wall portions 16 adapted to support and enclose one or more microwave circuits 18. Here, microwave circuit 18 comprises a conventional microwave monolithic integrated circuit (MMIC) amplifier supported on carrier assembly 20 bonded by conventional means to housing base portion 14. Carrier assembly 20 here comprises an electrically conductive support structure 22, here fabricated from copper tungsten or Kovar, having microwave strip transmission line circuit 24 disposed thereon. Here, strip transmission line circuit 24 is a microstrip circuit having a dielectric substrate 25 with a plurality of microstrip transmission line strip conductors 26 conventionally formed on the upper surface of substrate 25 and an electrically conductive ground plane 27 formed on the opposite or lower surface of dielectric substrate 25. Ground plane 27 is bonded by conventional electrically conductive means, such as soldering or electrically conductive epoxy, to support structure 22. It is thus seen that ground plane 27 is in electrical contact with support structure 22 and package housing 11. The dimensions of strip conductors 26 are selected to provide microstrip circuit 24 with a predetermined characteristic impedance, here 50 ohms. Microwave circuit 18 is conventionally mounted, such as by epoxy, on the upper surface of dielectric substrate 25, with microstrip strip conductors 26 being electrically connected in a conventional manner, such as by soldering, to leads 19 of such microwave circuit 18 for electrically coupling microwave signals to or from such microwave circuit 18.

Package housing 11 further includes an electrically conductive cover portion 15 which is sealably electrically connected to side wall portions 16 of housing by welding or soldering. Thus, microwave package 10 is hermetically sealed about microwave circuit 18, thereby protecting such circuit (and other components disposed within housing 11) from adverse environmental effects such as moisture.

Microwave circuit package 10 is typically electrically interconnected with other devices (such as other MMIC amplifiers) via conventional transmission line circuitry 40 having a predetermined characteristic impedance, such as 50 ohms. Here, transmission line 40 comprises a microstrip transmission line having strip conductor 42 disposed along a first surface of dielectric substrate 44, with an electrically conductive ground plane 46 being disposed on a second surface of substrate 44 and bonded, such as by welding, to metal shelf 48 of housing 11. Transmission line 40 is electrically coupled to a selected one of strip conductors 26 within package housing 11 via connector 12. Strip conductor 42 is conventionally bonded (as by soldering) to center pin 30 of connector 28 at a lap joint 50 between transmission line 40 and pin 30, as shown. Such lap joint connection 50 here is protected by cover board 52, which comprises a dielectric member bonded to transmission line 40 and overlaying lap joint 50, as shown.

Figure 2:
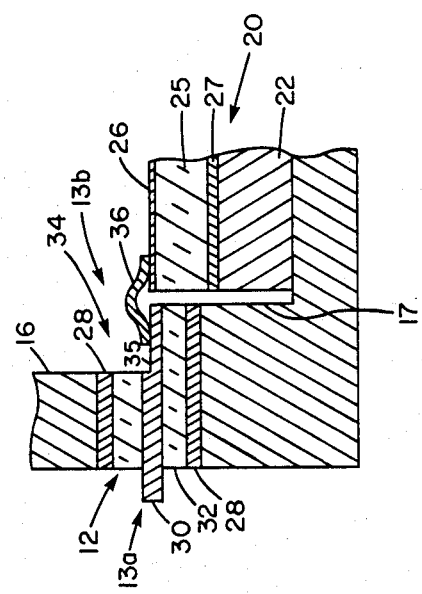
FIG. 2 is a cross-sectional view, taken along lines 2—2 of FIG. 1, of the connector of FIG. 1.

Feedthrough connector 12 of the present invention provides a hermetically sealed interface and electrical transition between transmission line mode of transmission line 40 and the strip transmission line mode of the microstrip circuitry 24 within package 10. That is, feedthrough connector 12 maintains the predetermined characteristic impedance (here, 50 ohms) between external transmission line 40 and the microstrip transmission line circuit 24 inside package 10. Referring also to FIG. 2, connector 12 comprises a generally rounded metal outer shell member 28 and a center conductor or pin 30 coaxially disposed longitudinally through shell 28. Center conductor 30 is insulatingly sealed within shell 28 by dielectric material 32, here comprising glass. The diameter of center conductor 30 and the inner diameter of shell 28 are selected to provide connector 12 with the same characteristic impedance as that of microstrip tranmission line circuit 24 and the external transmission line 40.

At the first, or external, end 13a of connector 12, center pin 30 protrudes beyond the end of shell 28 and interfaces with transmission line 40 at lap joint 50, as discussed. Such center pin 30 terminates coextensively with shell 28 at the second, or internal, end 13b of connector 12. Upper regions of the generally cylindrical shell 28, insulator 32 and center conductor 30 are removed, such as by grinding, at the second, or internal end 13b of connector 12 to form an electrical transition region 34 between the first and second ends 13a, 13b of connector 12. Preferably, the shell 28, glass 32 and center pin 30 are ground to form a planar surface disposed at the centerline of the connector 12 —that is, to expose center conductor 30 as a planar surface 35 at the internal end 13b of connector 12, such surface 35 here having a width equal to the diameter of center conductor 30. Thus, it is seen that at the first end 13a of connector 12, center conductor 30 is substantially entirely round and has a generally circular cross-section, such center pin 30 having a generally semicircular cross-section and comprising a planar portion 35 and a rounded portion in the transition region 34 and at the second end 13b of connector 12. The length of the transition region 34 will vary with the size of housing 11, but here is between 0.028 and 0.030 inches. It is further seen that connector 12 comprises a coaxial transmission line at the first end 13a thereof but substantially resembles a microstrip transmission line section at the second end 13b, such microstrip transmission line section 13b of connector 12 being integrally formed with the coaxial transmission line section 13a of connector 12. That is, at first end 13a, the ground plane for center conductor 30 (i.e., shell 28) completely surrounds center conductor 30, while in transition region 34 and at second end 13b such ground plane is disposed substantially below flattened center pin 30 and separated therefrom by dielectric 32. Thus, it may be appreciated that a microwave signal coupled to package 10 via transmission line 40 undergoes a first electrical transition from the microstrip transmission line mode of transmission line 40 to a coaxial transmission line mode at first end 13a of connector 12. Such microwave signal experiences a second electrical transition from a coaxial transmission line mode to a microstrip transmission line mode as the signal couples to the transition region 34 and second end 13b of connector 12.

Connector 12 is sealably mounted in an opening provided in housing side wall portion 16, for example, by soldering or welding shell 28 onto side wall 16. Thus, a hermetic seal is provided around mounted connector 12 and electrical continuity is provided between shell 28 and housing 11. As can be seen from FIGS. 1 and 2, connector 12 is mounted within housing 11 to position flat transition region 34 in substantially coplanar relationship with the upper surface of microstrip circuit 24 (i.e., the upper surface of dielectric substrate 25 on which strip transmission lines 26 are formed), for purposes to be discussed. The length of transition region 34 is here selected with the thickness of housing side wall 16 in mind so that the portions of connector 12 disposed within side wall 16 are fully cylindrical to provide maximum support, electrical interconnection and hermetic sealing around connector shell 28. Side wall portion 16 is provided with a ledge portion 17 to support the transition region 34 and second end 13b of connector 12.

As shown in FIG. 1, connector 12 and microstrip transmission line circuit 24 are disposed within housing 11 to place the planar upper surface 35 of the center pin 30 at the second end 13b of connector 12 adjacent to a first end of a selected microstrip strip conductor 26 of microstrip circuit 24. It is noted that the second end 13b is spaced from carrier assembly 20 by a nominal distance to allow for thermal expansion and contraction thereof. Electrical connection is made between flat surface portion 35 of center pin 30 and strip conductor 26 by a flexible electrically conductive ribbon 36, here made from a strip of gold. The ribbon 36 is thermo-compression bonded to surface 35 of center conductor 30 and strip conductor 26 to allow easy removal thereof when it becomes necessary to replace connector 12 or carrier assembly 20. Due to the flexibility of ribbon 36, electrical interconnection between center pin 30 and strip conductor 26 will be maintained without cracking during thermal expansion or contraction of carrier 20. It is noted that the portion of shell 28 disposed below center pin 30 in transistion region 34 provides such center conductor 30 with a continuous ground plane. Thus, as discussed, transition region 34 actually resembles a short section of a microstrip transmission line. A continuous ground connection is provided between connector shell 28 and microstrip transmission line ground plane 27 via housing 11 and support structure 22. Also, the transmission line length for which the ground plane is interrupted is kept short by keeping the space between connector second end 13b and carrier assembly 20 as small as practicable, thereby keeping the length of ribbon 36 as short as possible. The width of ribbon 26 over the short length thereof is selected to maintain the characteristic impedance between transition region 34 and microstrip transmission line 24. Thus, it is seen that connector 12 provides an electrical transition between a coaxial transmission line mode (at first end 13a thereof) and a microstrip transmission line mode (at second end 13b thereof and at microstrip circuit 24) while substantially maintaining a characteristic impedance (here, 50 ohms) match between the coaxial transmission line of the first end 13a of connector 13 and the microstrip transmission line 26 within package housing 11. Thus, the input/output stages necessary in prior art devices to provide such coaxial-to-microstrip transition are eliminated, thereby reducing the overall length, complexity and cost of microwave circuit package 10. To put it another way, connector 12 incorporates a coaxial transmission line (at first end 13a) and electrical transition to a microstrip transmission line (at second end 13b) in one part.

Having described a preferred embodiment of the present invention, modifications and alterations thereof may become apparent to those of ordinary skill in the art. For example, the first end 13a of connector 12 may alternately be arranged to make a coaxial connection with an external coaxial transmission line, rather than being adapted to form a "lap joint" with an external microstrip transmission line. Such alternate embodiment could be implemented by configuring first end 13a as, for example, a "male" or "female" "bullet" connector or other type of coaxial connector (such as SMA, TNC, etc.). Therefore, it is understood that the scope of the present invention is to be limited only by the scope of the appended claims.

What is claimed is:

1. A package having a strip transmission line circuit disposed within the package, said package comprising:
   a connector mounted in a wall of the package, the connector having: an outer, coaxial transmission line portion including a center conductor separated from a ground plane conductor by a substrate of dielectric material; and, an inner, strip transmission line portion including a strip conductor separated from a ground plane conductor by the substrate of dielectric material, the strip conductor having a first end spaced from the strip transmission line circuit, said connector comprising:
   (i) an electrically conductive center pin extending longitudinally through the connector and having an outer portion comprising the center conductor of the coaxial transmission line portion and an inner portion comprising the strip conductor of the strip transmission line portion, the outer portion of the center pin being substantially entirely round and the inner portion of the center pin having a round portion and a planar surface portion; and
   (ii) an electrically conductive shell comprising the ground plane conductor of the coaxial transmission line portion and the strip transmission line portion, said shell being disposed about substantially only the round portions of the center pin; and
   means for electrically coupling the inner portion of the center pin of the connector to the strip transmission line circuit.

2. The package of claim 1 wherein the electrical coupling means comprises a flexible strip of conductive material coupled at a first end thereof to the planar surface portion of the center pin.

3. The package of claim 1, wherein the outer portion of the connector is adapted to receive a microwave transmission line.

4. The package of claim 3 wherein said microwave transmission line comprises a strip transmission line.

5. In combination:
   a sealed package;

a microwave circuit disposed within the package, said circuit comprising a strip transmission line; and means for coupling microwave signals to the strip transmission line of the microwave circuit from a source disposed externally to the package, said coupling means comprising:

(i) a connector mounted in a wall of the package, the connector having a first end adapted to receive the external microwave signal and a second end disposed within the package and spaced from the strip transmission line of the microwave circuit, said connector comprising: an electrically conductive center pin disposed therethrough, the center pin being substantially entirely round at the first end of the connector and said center pin having a round portion and a planar surface portion at the second end of the connector; and electrically conductive shell member sealably mounted in the package wall and disposed about substantially only the round portions of the center pin; and, electrically insulating material disposed between the shell member and the round portions of the center pin; and (ii) an electrically conductive strip member coupled between the center pin at the second end of the connector and the strip transmission line of the microwave circuit.

6. The combination of claim 5 wherein the space between the second end of the connector and the strip transmission line of the microwave circuit changes from a nominal spacing in accordance with the ambient temperature of the package and microwave circuit, said conductive strip member being adapted to maintain electrical coupling between the the center pin at the second end of the connector and the strip transmission line of the microwave circuit as such spacing changes.

7. In combination:

an electrically conducting package;

a strip transmission line disposed within the package, said strip transmission line comprising a strip conductor;

a connector comprising a first end and a second end, the first end of the connector being mounted in a wall of said package and the second end of the connector protruding into the package, said connector further comprising:

(i) an electrically conductive shell, such shell having a substantially cylindrical first end at the first end of the connector and being secured to the wall;

(ii) a center conductor disposed longitudinally through the connector, such center conductor having a first end having a generally circular cross-section at the first end of the electrically conductive shell, said center conductor further having a second end having a generally semi-circular cross-section, comprising a rounded portion and a planar portion, at a second end of the electrically conductive shell, with the second end of the shell being disposed about substantially only the rounded portion of the center conductor, said second end of the center conductor being spaced from an end of the strip conductor of said strip transmission line;

(iii) a dielectric member disposed longitudinally through the conductive shell and separating the center conductor from the conductive shell; and (iv) an electrically conductive member coupled between the planar portion of the second end of the center conductor and the end of the strip conductor of the strip transmission line.

8. The combination of claim 7 wherein the spacing between the second end of the center conductor and the end of the strip conductor of the strip transmission line changes from a nominal spacing in accordance with changes in temperature of the package, said electrically conductive member being adapted to flex in response to said spacing changes to maintain coupling between the planar portion of the center conductor and the end of the strip conductor of said strip transmission line.

* * * * *